United States Patent
Yang

(10) Patent No.: US 6,913,957 B2
(45) Date of Patent: Jul. 5, 2005

(54) METHOD OF FABRICATING A THIN FILM TRANSISTOR ARRAY PANELSUBSTRATE

(75) Inventor: Ko-Chin Yang, Taipei (TW)

(73) Assignee: Quanta Display Inc., Taoyuan (TW)

( * ) Notice: Subject to any disclaimer, the term of this patent is extended or adjusted under 35 U.S.C. 154(b) by 129 days.

(21) Appl. No.: 10/604,806

(22) Filed: Aug. 19, 2003

(65) Prior Publication Data

US 2004/0191968 A1 Sep. 30, 2004

(30) Foreign Application Priority Data

Mar. 31, 2003 (TW) .................................. 92107249 A

(51) Int. Cl.⁷ .......................... H01L 21/00; H01L 21/84
(52) U.S. Cl. ..................................................... 438/151
(58) Field of Search ........................ 438/151, 149–150, 438/152, 157

(56) References Cited

U.S. PATENT DOCUMENTS 5,407,845 A   4/1995 Nasu et al. .................. 437/40
6,255,130 B1 * 7/2001 Kim ............................ 438/30

* cited by examiner

Primary Examiner—Craig A. Thompson
(74) Attorney, Agent, or Firm—Jiang Chyun IP office

(57) ABSTRACT

A method of fabricating a thin film transistor array substrate is described. A gate and a scan line electrically connected to the gate are formed on a substrate. A gate insulating layer is formed over the substrate. A patterned channel layer and a patterned ohmic contact layer are formed on the gate insulating layer above the gate. A transparent conductive layer and a metal layer are formed and patterned to define a source/drain region, a data line and a pixel region. A passivation layer exposing the metal layer on the pixel region is formed over the substrate. The metal layer exposed by the passivation layer is removed to expose the transparent conductive layer on the pixel region, using the passivation layer as a photomask, so as to form a pixel electrode. Since the process only needs four photomasks, the process cost can be reduced.

15 Claims, 6 Drawing Sheets

METHOD OF FABRICATING A THIN FILM TRANSISTOR ARRAY PANELSUBSTRATE

CROSS REFERENCE TO RELATED APPLICATIONS

This application claims the priority benefit of Taiwan application serial no. 92107249, filed Mar. 31, 2003.

BACKGROUND OF INVENTION

1. Field of Invention

The present invention relates to a method of fabricating a thin film transistor array substrate. More particularly, the present invention relates to a method of fabricating a thin film transistor array substrate to reduce the number of photomasks used in the processes.

2. Description of Related Art

A thin film transistor liquid crystal display (TFT-LCD) mainly comprises a thin film transistor (TFT) array substrate, a color filter array substrate and a liquid crystal layer. The TFT array substrate is constructed from a plurality of pixel structures. Each pixel structure comprises a thin film transistor and a pixel electrode corresponding to the thin film transistor. The thin film transistor comprises a gate electrode, a channel layer, a source and a drain. The thin film transistor serves as a switching element for each liquid crystal display cell.

In general, the conventional process of fabricating of a thin film transistor array substrate needs five sheets of photomasks. The first sheet of photomask is used for patterning the first metal layer to form scan lines and gates of the thin film transistor. The second sheet of photomask is used for defining channel layers and ohmic contact layers of the thin film transistors. The third sheet of photomask is used for defining second metal layers to form data lines and source/drain regions of the thin film transistors. The fourth sheet of photomask is used for patterning a passivation layer. The fifth sheet of photomask is used for patterning a transparent conductive layer to form a pixel electrode.

However, under the demands of the market, as the development of the thin film transistor liquid crystal display trends to larger scale, the process of fabricating the thin film transistor liquid crystal display confronts tremendous problems and challenges, for example, yield or through-put reduction. Hence, if the mask numbers of the process can be decreased, the steps of the process decrease. The process time can be reduced and the throughput can be increased, so that the process cost can be cut down.

U.S. Pat. No. 5,407,845 discloses a method of manufacturing thin film transistor using four sheets of photomasks. A first sheet of photomask is used for defining a first metal to form scan lines and gates of the thin film transistors. A second sheet of photomask is used for patterning active layers, i.e., channel layers, and insulating channel protective films on the active layers. Thereafter, an anisotropic etching process is conducted to remove a portion of the sidewall of the insulating channel protective films, and then the sides of the active layers are doped with ions using the insulating channel protective films as an implanting mask. A third sheet of photomask is used for patterning the second metal layer and indium tin oxide layer to form data lines, source/drain regions and pixel electrodes. A fourth sheet of photomask is used for patterning a passivation layer. The patterned passivation layers are used as a mask to remove the second metals of the pixel electrodes so as to expose the indium tin oxide layers.

SUMMARY OF INVENTION

Accordingly, the present invention provides a method of fabricating the thin film transistor array substrate to decrease the number of the masks used in the processes so as to cut down the cost of the process.

The present invention is to provide a method of fabricating the thin film transistor array substrate using a four photomask process, which is different from the prior art.

To achieve these and other advantages and in accordance to the purpose of the invention, as embodied and broadly described herein, the invention provides a method of fabricating a thin film transistor array substrate. First, gates, scan lines electrically connected to the gate, and common lines substantially parallel to the scan lines are formed on a substrate. At the same time, first terminals are formed on the substrate, wherein each of the first terminals electrically connects to an end of each scan line at one edge of the substrate. The common lines serve as bottom electrodes of pixel capacitors. Thereafter, a gate insulating layer covering the gates, the scan lines, the common lines and the first terminals is formed over the substrate. Patterned channel layers and patterned ohmic contact layers are formed on the gate insulating layer above the gates. A transparent conductive layer and a metal layer are formed and patterned to define source/drain regions, data lines, pixel regions and second terminals, wherein the data lines connect to the source regions and the ends of the data lines connect to the second terminals. The gates, the channel layers and the source/drain regions construct a thin film transistor array. A pssivation layer is formed over the substrate, wherein the passivation layer exposes the metal layers on the pixel regions and the second terminals and the gate insulating layers on the first terminals. The gate insulating layer and the metal layers exposed by the passivation layer are removed to expose the first terminals and the transparent conductive layers on the pixel regions and the second terminals, using the passivation layer as a mask. The transparent conductive layer of the pixel regions serves as a plurality of pixel electrodes. The pixel electrodes above the common lines serve as a plurality of plate electrodes of the pixel capacitors.

In the method of fabricating the thin film transistor array substrate mentioned above, transparent conductive layers can be selectively formed on the gates, the scan lines, the common lines and the first terminals to protect and prevent the first terminals from damage during the subsequent etching process. However, if the material of the first terminals can resist etching damage in the subsequently process, the transparent conductive layer is not necessary.

This invention also provides a method of fabricating a thin film transistor array substrate. First, gates, scan lines electrically connected to the gates and common lines substantially parallel to the scan lines are formed on a substrate. At the same time, first terminals are formed on the substrate, wherein each of first terminals electrically connects to an end of each of the scan lines at one edge of the substrate. The common lines serve as a plurality of bottom electrodes of a plurality of pixel capacitors. Thereafter, a gate insulating layer covering the gates, the scan lines, the common lines and the first terminals is formed over the substrate. A channel material layer and an ohmic contact material layer are formed on the gate insulating layer above the gates. A photoresist layer is formed on the ohmic contact material layer, wherein the photoresist layer exposes the ohmic contact material layer on the first terminals, and a thickness of the photoresist layer corresponding to the gate is thicker than a thickness of the photoresist layer corresponding to others. The ohmic contact material layer, the underlying channel material layer and the underlying gate insulating layer exposed by the photoresist layer are removed to expose the first terminals. Thereafter, the portion of the photoresist layer except that above the gates is removed to remain remained photoresist layers directly above the gates. The ohmic contact material layer and the channel material layer are patterned using the remained photoresist layers as a mask layer to define and form patterned ohmic contact layers and patterned channel layers on the gate insulating layer formed above the gates. A transparent conductive layer and a metal layer are formed over the substrate. The metal layer and the transparent conductive layer are patterned to form source/drain regions, data lines, pixel regions, second terminals and conductive clumps. The conductive clumps are on the first terminals and electrically connect to the second terminals, and the data lines electrically connect to the source/drain regions and an end of each of the data lines electrically connects to each of the second terminals. A passivation layer is formed over the substrate, wherein the passivation layer exposes the metal layers on the pixel regions, the second terminals and the conductive clumps. The metal layer exposed by the passivation layer is removed to expose the transparent conductive layer of the pixel regions, the second terminals and the conductive clumps, using the passivation layer as a mask. The transparent conductive layers on the pixel regions serve as a plurality of pixel electrodes, and the pixel electrodes above the common lines serve as a plurality of plate electrodes of pixel capacitors. The transparent conductive layers on the conductive clumps connect to the data lines through the second terminals.

In a second embodiment of the method of fabricating a thin film transistor array substrate, transparent conductive layers also can be selectively formed on the gates, the scan lines, the common lines and the first terminals to protect the first terminals and prevent the first terminals from damage during the subsequent etching process. However, if the material of the first terminal can resist etching damage in the subsequently process, the transparent conductive layer is not necessary.

The method of fabricating a thin film transistor array substrate according to this invention only requires four sheets of photomasks, less than the prior art. The number of the photomask is decreased, so that the cost of the process can be cut down.

In the method of fabricating a thin film transistor array substrate according to this invention using four photomasks, the second photomask is used for defining the channel layer and the ohmic contact layer. Even in the second embodiment of this invention, the second photomask can further be used for exposing the first terminals. In the process of the prior art using four photomasks, the second photomask is used for defining an active layer, i.e., a channel layer and an insulating channel protective film. Therefore, the technique of this invention is different from that of the prior art.

In addition, in the method of fabricating a thin film transistor array substrate according to this invention, the scan lines connect to the data lines through the first terminals and the second terminals, so that it is convenient to the design of the electrostatic discharge protection circuits and the other integrated circuits.

It is to be understood that both the foregoing general description and the following detailed description are exemplary, and are intended to provide further explanation of the invention as claimed.

BRIEF DESCRIPTION OF DRAWINGS

The accompanying drawings are included to provide a further understanding of the invention, and are incorporated in and constitute a part of this specification. The drawings illustrate embodiments of the invention and, together with the description, serve to explain the principles of the invention.

DETAILED DESCRIPTION

Figure 1:
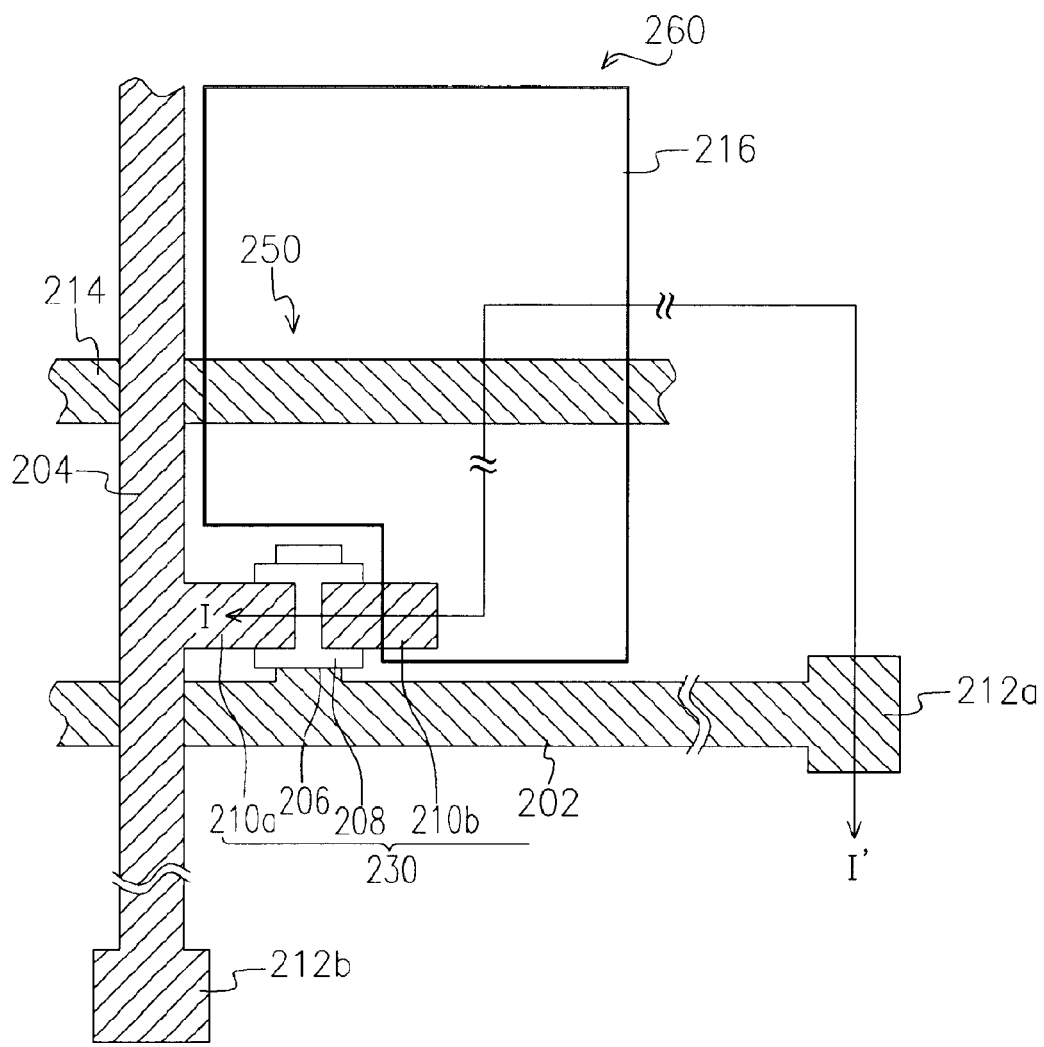
FIG. 1 is a schematic top view of a pixel structure of a thin film transistor array substrate according to an embodiment of this invention.

First Embodiment FIG. 1 is a schematic top view of a pixel structure of a thin film transistor array substrate according to an embodiment of this invention; and FIGS. 2A to 2E, which are schematic cross-sectional views along line I–I" of FIG. 1, are schematic cross-sectional views of a pixel structure of a thin film transistor array substrate according to the first embodiment of this invention.

Figure 2A:
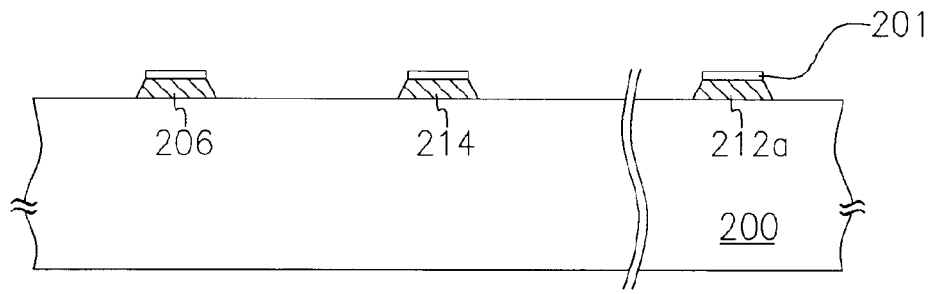
FIGS. 2A to 2E are schematic cross-sectional views of a pixel structure of a thin film transistor array substrate according to the first embodiment of this invention.

Referring to FIGS. 1 and 2A, first a substrate 200 such as a glass substrate or a plastic substrate is provided. A first metal layer M1 (not shown) is formed on the substrate 200. A first photomask process is conducted to define a gate 206, a scan line 202 electrically connected to the gate 206, a common line 214, and a first terminal 212a at one terminal of the scan line 202. The common line 214 is substantially parallel to the scan line 202 and serves as a bottom electrode of a pixel capacitor. The first terminal 212a electrically connects to the scan line 202 at one edge of the substrate 200 and electrically connects to an integrated circuit driver. In an embodiment, a material of the first metal layer is, for example, Cr, W, Ta, Ti, Mo, Al or an alloy.

It should be noted that a transparent conductive layer 201 can be selectively formed on the gate 206, the scan line 202, the common line 214 and the first terminal 212a to protect the first terminal 212a and prevent the first terminal 212a from damage during the subsequent etching process. A material of the transparent conductive layer 201 is, for example, indium tin oxide (ITO) or indium zinc oxide (IZO). That is, a first metal layer is first formed on the substrate 200, and then a transparent conductive layer (not shown) is formed on the first metal layer. Thereafter, the first metal layer and the transparent conductive layer are patterned to form the gate 206, the scan line 202, the common line 214 and the first terminal 212a and form the transparent conductive layers 201 formed thereon. If the material of the first metal layer can resist etching damage in the subsequently process, the transparent conductive layer is not necessary.

Figure 2B:
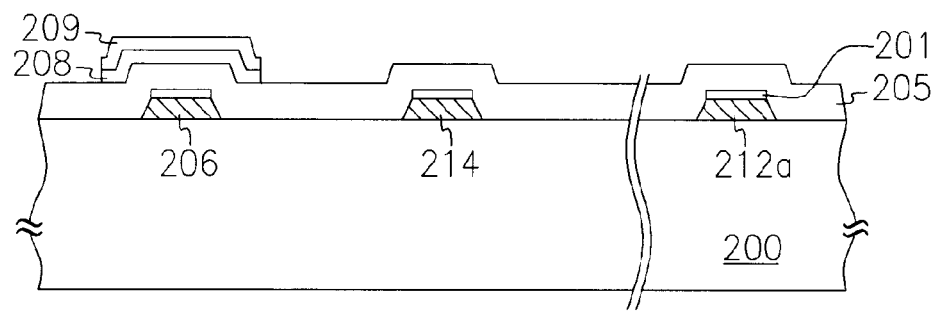

Referring to FIG. 1 and FIG. 2B, a gate insulating layer 205 covering the gate 206, the scan line 202, the common line 214 and the first terminal 212a is formed over the substrate 200. In one embodiment, the gate insulating layer 205 is made of, for example, silicon nitride, silicon oxide or silicon oxy-nitride.

Thereafter, a channel material layer (not shown) and an ohmic contact material layer (not shown) are formed over the substrate 200. A second photomask process for defining the channel material layer and the ohmic contact material layer is performed to form a patterned channel layer 208 and a patterned ohmic contact layer 209 on the gate insulating layer 205 above the gate 206. In one embodiment, the channel material layer is such as an amorphous silicon layer, and the ohmic contact material layer is such as a doped amorphous silicon layer.

Figure 2C:
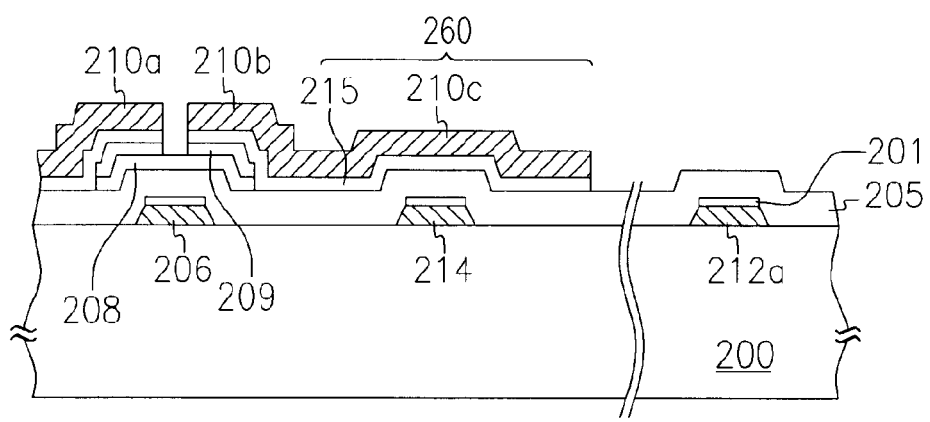

Referring to FIG. 1 and FIG. 2C, a transparent conductive layer (not shown) and a second metal layer (not shown) are formed over the substrate 200. A third photomask process for patterning transparent conductive layer and the second metal layer is conducted to form a patterned layer to define a data line 204, a source/drain region 210a/210b, a pixel region 260 and a second terminal 212b at one end of the date line 204. The data line 204 electrically connects to the source 210a and the second terminal 212b. The second terminal 212b, which connects to the data line 204 at one edge of the substrate 200, is used for bonding to an integrated circuit driver. In this step, all of the data line 204, the source/drain region 210a/210b, the pixel region 260 and the second terminal 212b form a two-layer structure including an upper metal layer and an underlying transparent conductive layer 215. The pixel region 260 is also a two-layer structure. In an embodiment, a material of the second metal layer is, for example, Cr, W, Ta, Ti, Mo, Al or an alloy. A material of the transparent conductive layer 215 is, for example, indium tin oxide or indium zinc oxide.

The ohmic layer 209 over the gate 206 exposed by the second metal layer is removed to expose the channel layer 208.

Figure 2D:
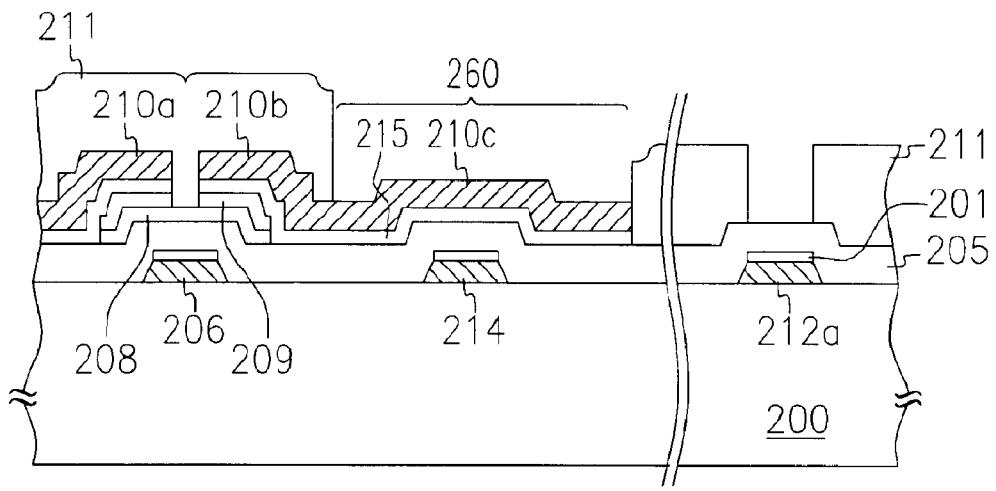
Figure 2E:
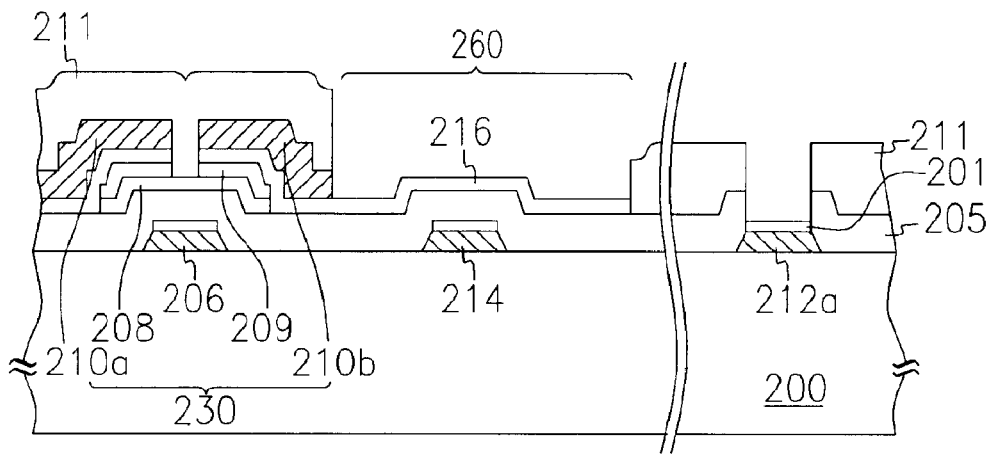

Referring to FIG. 1, FIG. 2D and FIG. 2E, a pssivation layer (not shown) is formed over the substrate 200. A fourth photomask process is performed to form a patterned passivation layer 211, wherein the passivation layer 211 exposes the metal layer of the pixel region 260 and the second terminal 212b and the gate insulating layer 205 on the first terminal 212a. A material of the passivation layer 211 is, for example, silicon nitride, silicon oxy-nitride or organic material.

Thereafter, the gate insulating layer 205 and the metal layer exposed by the passivation layer 211 are removed to expose the first terminal 212a (or the transparent conductive layer 201 on the first terminal 212a) and the transparent conductive layers 215 on the pixel region 260 and the second terminal 212b, using the patterned passivation layer 211 as an etching mask. The transparent conductive layer 215 on the pixel region 260 serves a pixel electrode 216.

It should be noted that the common line 214, the pixel electrode 216 above the common line 214 and the gate insulating layer 205 between the common line 214 and the pixel electrode 216 construct a pixel capacitor 250. The common line 214 serves as a bottom electrode, the pixel electrode 216 above the common line 214 serves as a plate electrode and the gate insulating layer 205 between the common line 214 and the pixel electrode 216 serves as a dielectric layer.

The method of fabrication of the thin film transistor array substrate mentioned above only uses four photomask process. The first photomask process is used for patterning the first metal layer to form a gate, scan line, common line and the first terminal. The second photomask process is used for defining the channel layer and the ohmic contact layer. The third photomask process is used for defining the second metal layer and the transparent conductive layer to form the data line, the source/drain region, the pixel region and the second terminal. The fourth photomask process is used for patterning the passivation layer. In the subsequent process, the patterned passivation layer, which serves as an etching mask, is used to remove the second metal layer on the pixel region to expose the transparent conductive layer, so as to form the pixel electrode. At the same time, the gate insulating layer on the first terminal is removed to expose the first terminal.

Second Embodiment FIGS. 3A to 3I, which are schematic cross-sectional views along line I–I" of FIG. 1, are schematic cross-sectional views of a thin film transistor array substrate according to the second embodiment of this invention.

Figure 3A:
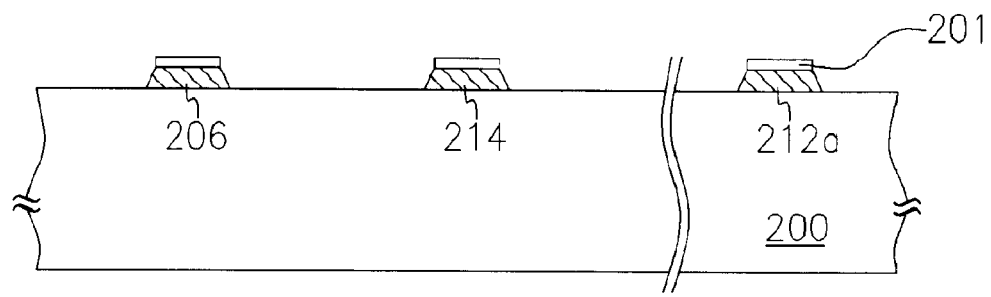
FIGS. 3A to 3I are schematic cross-sectional views of a pixel structure of a thin film transistor array substrate according to the second embodiment of this invention.

Referring to FIG. 1 and FIG. 3A, first a substrate 200 such as a glass substrate or a plastic substrate is provided. A first metal layer Ml (not shown) is formed on the substrate 200. A first photomask process is conducted to define a gate 206, a scan line 202 electrically connected to the gate 206, a common line 214 and a first terminal 212a at one end of the scan line 202. The common line 214 is parallel to the scan line 202 and serves as a bottom electrode of a pixel capacitor. The first terminal 212a electrically connects to the scan line 202 at one edge of the substrate 200 and electrically bonds to an integrated circuit driver. In an embodiment, a material of the first metal layer is, for example, Cr, W, Ta, Ti, Mo, Al or an alloy.

In the same way, in this embodiment, a transparent conductive layer 201 can be selectively formed on the gate 206, the scan line 202, the common line 214 and the first terminal 212a to protect and prevent the first terminal 212 a from damage during the subsequent etching process. A material of the transparent conductive layer 201 is for example, indium tin oxide or indium zinc oxide. That is, a first metal layer is first formed on the substrate 200, and then a transparent conductive layer (not shown) is formed on the first metal layer. Thereafter, the first metal layer and the transparent conductive layer are patterned to form the gate 206, the scan line 202, the common line 214 and the first terminal 212a and the transparent conductive layers 201 formed thereon. If the material of the first metal layer can resist etching damage in the subsequent process, the transparent conductive layer is not necessary.

Figure 3B:
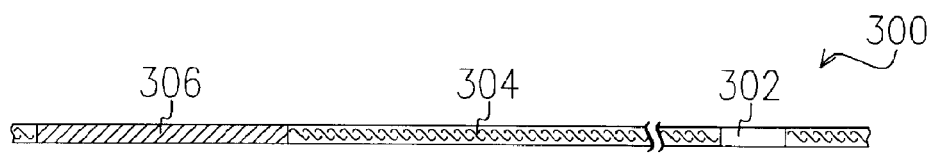
Figure 3B:
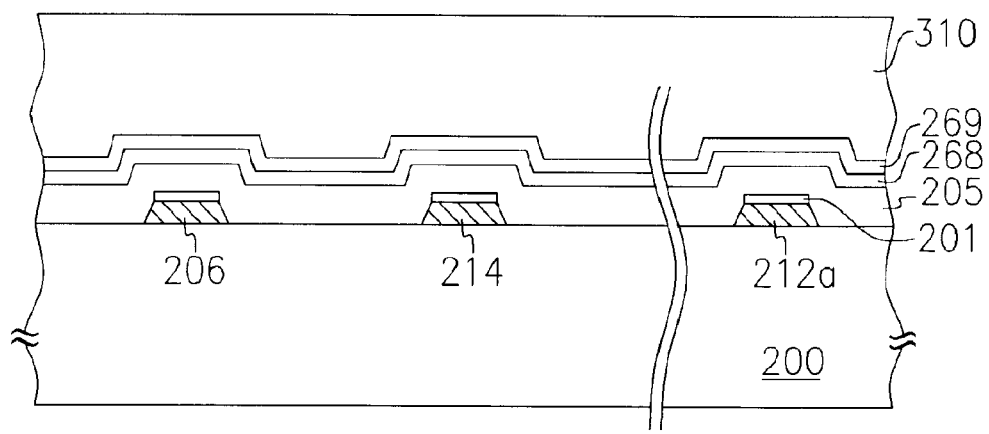

Referring to FIG. 1 and FIG. 3B, a gate insulating layer 205 covering the gate 206, the scan line 202, the common line 214 and the first terminal 212a is formed over the substrate 200. In one embodiment, the gate insulating layer 205 is made of, for example, silicon nitride, silicon oxide or silicon oxy-nitride. Thereafter, a channel material layer 268 and an ohmic contact material layer 269 are formed the gate insulating layer 205.

Thereafter, a second photomask process is performed. A photoresist layer 310 is first formed on the ohmic contact material layer 269 and then an exposure process using a photomask and a development process are conducted to form a patterned photoresist layer 310a, as shown in FIG. 3C.

Figure 3C:
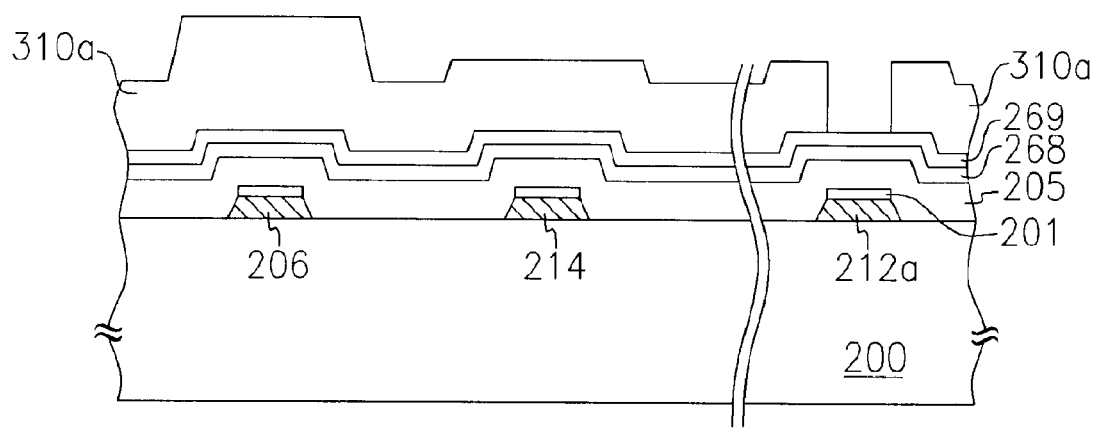
Figure 3D:
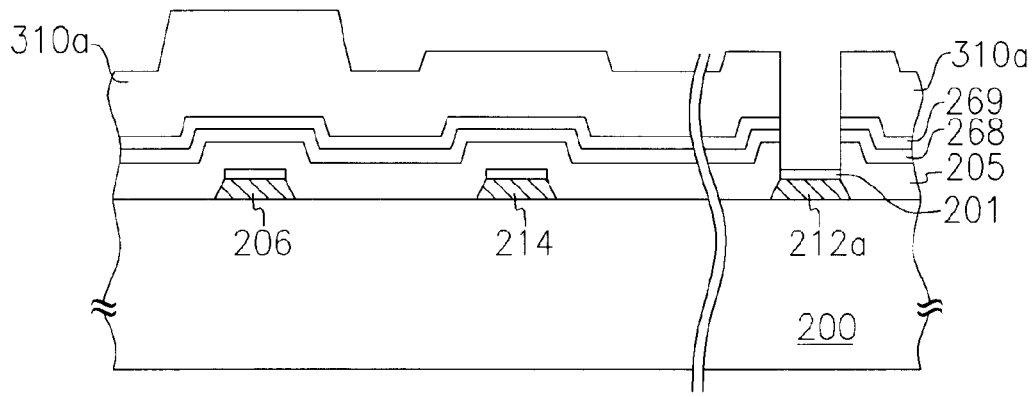

Referring to FIG. 3C, the patterned photoresist layer 310a exposes ohmic contact material layer 269 over the first terminal 212a, and a thickness of the patterned photoresist layer 310a corresponding to the gate 206 is thicker than a thickness of the patterned photoresist layer 310a corresponding to others rather than the gate 206.

It should be noted that a pattern design of the photomask 300 is closely related to a material of the photoresist layer 310. If the material of the photoresist layer 310 is positive photoresist, the photomask 300 comprises a transparent area 302 corresponding to a position of the first terminal 212a, an opaque area 306 corresponding to a position of the gate 206 and a semi-opaque area 304 corresponding to a position other than the first terminal 212*a* and the gate 206. If the material of the photoresist layer 310 is negative photoresist, the photomask 300 comprises an opaque area 302 corresponding to a position of the first terminal 212*a*, a transparent area 306 corresponding to a position of the gate 206 and a semi-opaque area 304 corresponding to a position other than the first terminal 212*a* and the gate 206. After the exposure process using the photomask 300 and the development process are conducted, the photoresist layer 310 corresponding to the position of the first terminal 212*a* is removed completely, and the photoresist layer 310 corresponding to the position other than the first terminal 212*a* and the gate 206 is removed partially. Therefore, the remained photoresist layer 310*a* exposes the ohmic contact material layer 269 on the first terminal 212*a*, and the thickness of the patterned photoresist layer 310*a* corresponding to the gate 206 is thicker than the thickness of the patterned photoresist layer 310*a* corresponding to others rather than the gate 206.

Figure 3E:
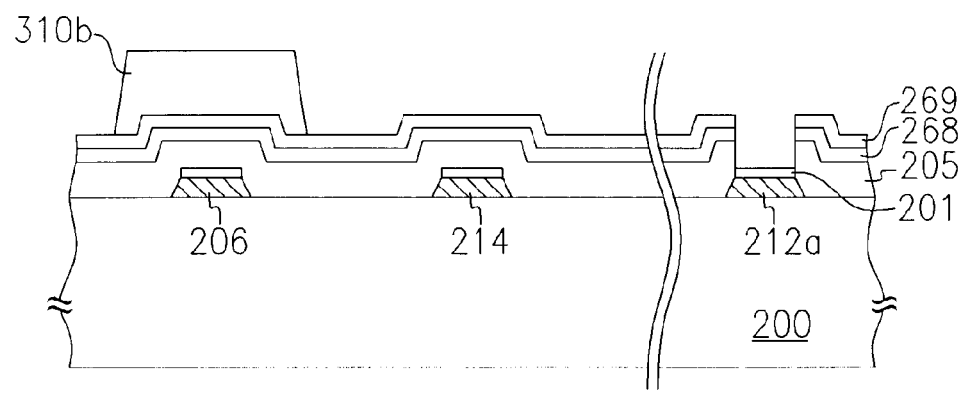

Referring to FIG. 3E, an ashing process is performed to remove a portion of the photoresist layer until the channel material layer is exposed except above the gate. The thickness of the patterned photoresist layer 310*a* corresponding to the gate 206 is thicker than the thickness of the patterned photoresist layer 310*a* corresponding to the others rather than the gate 206, so that a remained photoresist layer 310*b* above the gate 206 is remained.

Figure 3F:
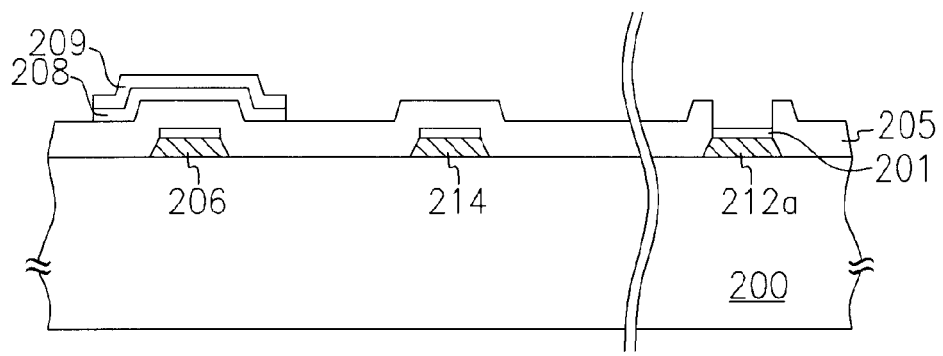

Referring to FIG. 3F, an etching step is performed, using the remained photoresist layer 310*b* as an etching mask, to pattern the channel material 268 and the ohmic contact material layer 269, so as to form a channel layer 208 and an ohmic contact layer 209.

Figure 3G:
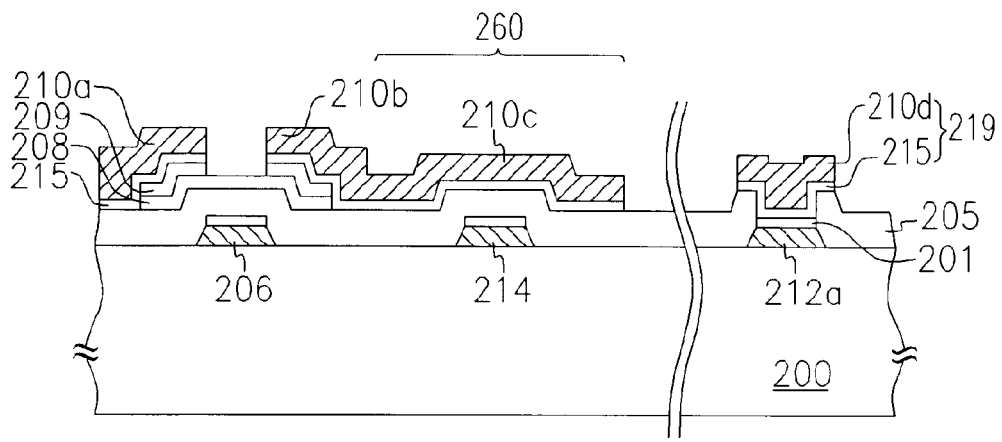

Referring to FIG. 3G, a transparent conductive layer (not shown) and a metal layer (not shown) are formed over the substrate 200. Thereafter, a third photomask process is performed to pattern the metal layer and the transparent conductive layer so as to form a data line 204, a source 210*a*, a drain 210*b*, a pixel region 260, a second terminal 212*b* and a conductive clump 219.

The data line 204 electrically connects to the source 210*a* and an end of the data line 204 electrically connects to the second terminal 212*b*. The conductive clump 219, which is on the first terminal 212*a*, electrically connects to the second terminal 212*b*. The second terminal 212*b* is used for bonding to an integrated circuit driver. In this step, all of the data line 204, the source 210*a*, drain 210*b* and the second terminal 212*b* form a two layer structure including an upper metal layer and an underlying transparent conductive layer 215. The pixel region 260 is also a two-layer structure including an upper metal layer 210*c* and the underlying transparent conductive layer 215. In addition, the conductive clump 219 on the first terminal 212*a* also includes an upper metal layer 210*d* and an underlying transparent conductive layer 215. In an embodiment, a material of the second metal layer is, for example, Cr, W, Ta, Ti, Mo, Al or an alloy. A material of the transparent conductive layer 215 is, for example, indium tin oxide or indium zinc oxide.

Thereafter, the ohmic contact layer 209 over the gate 206 exposed by the second metal layer is removed to expose the underlying channel layer 208.

Figure 3H:
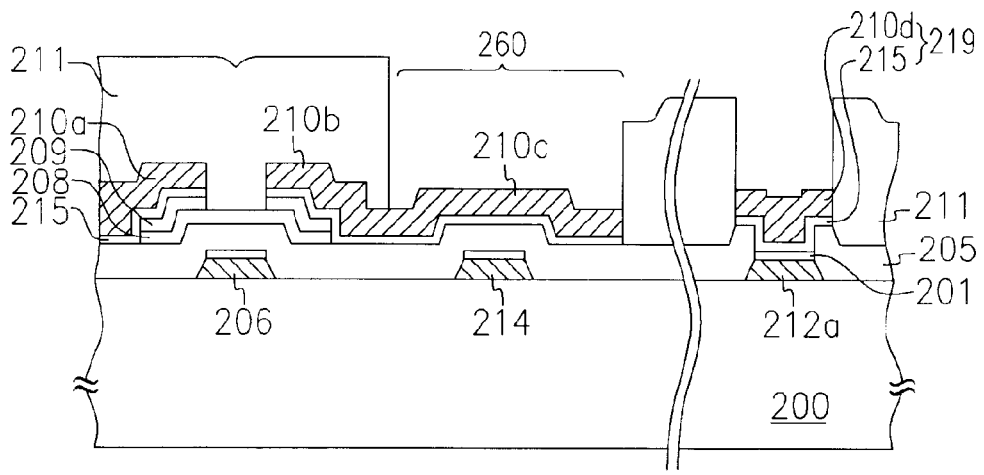
Figure 3I:
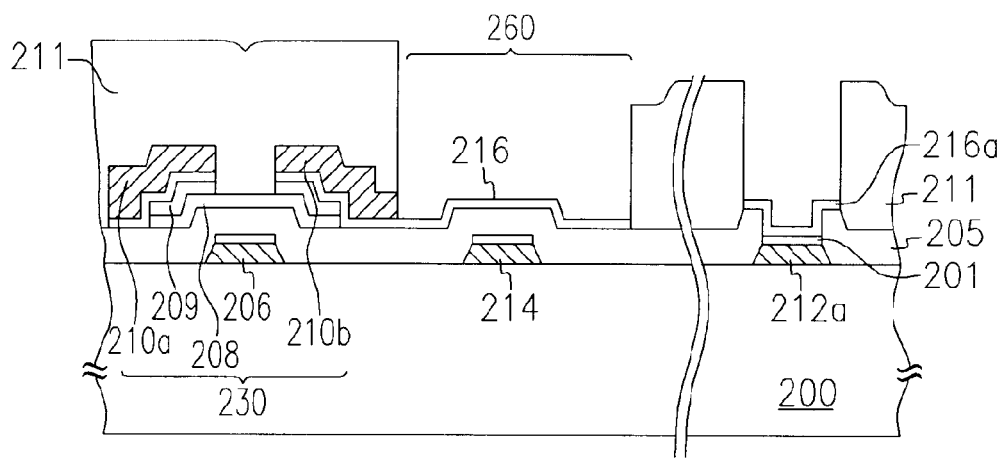

Referring to FIG. 1, FIG. 3H and FIG. 3I, a pssivation layer (not shown) is formed over the substrate 200. A fourth photomask process is performed to form a patterned passivation layer 211, wherein the passivation layer 211 exposes the metal layer of the pixel region 260 and the second terminal 212*b* and the conductive clump 219 on the first terminal 212*a*. A material of the passivation layer 211 is, for example, silicon nitride, silicon oxy-nitride or organic material.

Thereafter, using the patterned passivation layer 211 as an etching mask, the metal layer on the pixel region 260, the second terminal 212*b* and the conductive clump 219 exposed by the passivation 211 are removed, so that the transparent conductive layers 215 on the pixel region 260, the second terminal 212*b* and the first terminal 212*a* are exposed. The exposed transparent conductive layer 215 on the pixel region 260 is a pixel electrode 216.

The remained transparent conductive layer 215 on the first terminal 212*a* serves as a contact layer 216*a*, which electrically connects to the second terminal 212*b*, so that the scan line 202 can electrically connects to the data line 204 through the contact layer 216*a* on the first terminal 212 connecting to the second terminal 212*b*. The first terminal 212*a* is exposed during the second photomask process and the conductive clump 219 electrically connecting to the second terminal 212*b* is formed during the third photomask process. Therefore, the contact layer 216*a*, i.e., the remained transparent conductive layers 215, still contacts to the second terminal 212*b* after the metal layer 210*d* of the conductive clump 219 is removed. It is convenient for the design of the electrostatic discharge protection circuits and the other integrated circuits that the scan line (the first metal layer) 202 connects to the data line (the second metal line) 204.

In the design of an electrostatic discharge protection circuit, a protection circuit comprises two thin film transistors, and each of the gates connects to each of the sources so as to form two reversed diodes. That is, the first metal layer used for forming the gate must connect to the second metal layer used for forming the source to fit the design. In this case, the first metal layer used for forming the gate and the second metal layer used for forming the source are connected through the contact layer on the first terminal and the transparent conductive layer of the second terminal contacting to the contact layer.

In addition, the common line 214, the pixel electrode 216 above the common line 214 and the gate insulating layer 205 between the common line 214 and the pixel electrode 216 construct a pixel capacitor 250. The common line 214 serves as a bottom electrode, the pixel electrode 216 above the common line 214 serves as a plate electrode and the gate insulating layer 205 between the common line 214 and the pixel electrode 216 serves as a dielectric layer.

The method of fabrication of the thin film transistor array substrate mentioned above only uses a four photomask process. The first photomask process is used for patterning the first metal layer to form gate, scan line, common line and the first terminal. The second photomask process is used for defining the channel layer and the ohmic contact layer and exposing the first terminal. The third photomask process is used for defining the second metal layer and the transparent conductive layer to form the data line, the source/drain region, the pixel region, the second terminal and the conductive clump. The fourth photomask process is used for patterning the passivation layer. In the subsequent process, the patterned passivation layer, which serves as an etching photomask, is used to remove the second metal layer on the pixel region to expose the transparent conductive layer, so as to form the pixel electrode. At the same time, the metal of the conductive clump on the first terminal is removed to expose the transparent conductive layer.

The method of fabricating a thin film transistor array substrate according to this invention only requires four photomasks, less than the prior art. The number of the photomasks is decreased, so that the cost of the process can be cut down.

In the method of fabricating a thin film transistor array substrate according to this invention using four photomasks, the second photomask is used for defining the channel layer and the ohmic contact layer. In the second embodiment of this invention, the second photomask can further be used for exposing the first terminal. However, in the four photomask process of the prior art, the second photomask is used for defining an active layer, i.e., a channel layer and an insulating channel protective film. Therefore, the technique of this invention is different from that of the prior art.

In addition, in the method of fabricating a thin film transistor array substrate according to this invention, the scan line connects to the data line through the first terminal and the second terminal. Therefore, it is convenient for the design of the electrostatic discharge protection circuits and other integrated circuits.

It will be apparent to those skilled in the art that various modifications and variations can be made to the structure of the present invention without departing from the scope or spirit of the invention. In view of the foregoing, it is intended that the present invention covers modifications and variations of this invention provided they fall within the scope of the following claims and their equivalents.

What is claimed is:

1. A method of fabricating a thin film transistor array substrate, comprising:
    forming a plurality of gates and a plurality of scan lines electrically connected to the gates on a substrate;
    forming a gate insulating layer covering the gates and the scan lines;
    forming a channel layer and an ohmic contact layer on the gate insulating layer above the gates;
    forming a transparent conductive layer over the substrate;
    forming a metal layer on the transparent conductive layer;
    patterning the metal layer and the transparent conductive layer to form a plurality of source/drain regions, a plurality of data lines and a plurality of pixel regions;
    forming a passivation layer over the substrate exposing the metal layers on the pixel regions; and
    removing the metal layer exposed by the passivation layer to expose the transparent conductive layer on the pixel regions, using the passivation layer as a mask, wherein the transparent conductive layer on the pixel regions serves as a plurality of pixel electrodes.

2. The method of fabricating the thin film transistor array substrate of claim 1, further comprising forming a plurality of first transparent conductive layers on the gates and the scan lines.

3. The method of fabricating the thin film transistor array substrate of claim 1, wherein the step of forming the gates and the scan lines further comprises forming a plurality of first terminals electrically connected to the scan lines at one edge of the substrate, and the step of patterning the metal layer and the transparent conductive layer further comprises forming a plurality of second terminals electrically connected to the data lines at another edge of the substrate.

4. The method of fabricating the thin film transistor array substrate of claim 3, further comprising forming a plurality of first transparent conductive layers on the gates, the scan lines and the first terminals.

5. The method of fabricating the thin film transistor array substrate of claim 3, wherein the step of forming the passivation layer comprises exposing the metal layers on the pixel regions and the second terminals, and the step of removing the metal layers exposed by the passivation layer includes exposing the transparent conductive layers on the pixel regions and the second terminals.

6. The method of fabricating the thin film transistor array substrate of claim 1, wherein the step of forming the gates and the scan lines further comprises forming a common lines, wherein the common lines serve as bottom electrodes of a plurality of pixel capacitors and the pixel electrodes above the common lines serve as plate electrodes of the pixel capacitors.

7. The method of fabricating the thin film transistor array substrate of claim 1, further comprising forming a plurality of first transparent conductive layers on the gates, the scan lines and the common lines.

8. A method of fabricating a thin film transistor array substrate, comprising:
    forming a plurality of gates, a plurality of scan lines and a plurality of first terminals on a substrate, wherein the scan lines electrically connected to the gates and the first terminals;
    forming a gate insulating layer covering the gates, the scan lines and the first terminals;
    forming a channel material layer on the gate insulating layer;
    forming a photoresist layer over the substrate, wherein the photoresist layer exposes the channel material layers on the first terminals, and a thickness of the photoresist layer corresponding to the gates is thicker than a thickness of the photoresist layer corresponding to others;
    removing the channel material layer and the underlying gate insulating layer exposed by the photoresist layer to expose the first terminals;
    removing a plurality of portion of the photoresist layer until the channel material layer is exposed except that above the gates to remain a remained photoresist layer above the gates;
    patterning the channel material layer using the remained photoresist layer as a mask layer to define and form a plurality of channel layers on the gate insulating layer formed above the gates;
    forming a transparent conductive layer over the substrate;
    forming a metal layer on the transparent conductive layer;
    patterning the metal layer and the transparent conductive layer to form a plurality of source/drain regions, a plurality of data lines, a plurality of pixel regions, a plurality of second terminals and a plurality of conductive clumps, wherein the conductive clumps are on the first terminals and electrically connect to the second terminals, and the data lines electrically connect to the source/drain regions and the second terminals;
    forming a passivation layer over the substrate exposing the metal layer on the pixel regions, the second terminals and the conductive clumps; and
    removing the metal layer exposed by the passivation layer to expose the transparent conductive layer on the pixel regions, the second terminals and the conductive clumps, using the passivation layer as a mask, wherein the transparent conductive layer on the pixel regions serves as a plurality of pixel electrodes.

9. The method of fabricating the thin film transistor array substrate of claim 8, further comprising forming a wherein the transparent conductive layer on the pixel regions serves as a plurality of pixel electrodes of first transparent conductive layer on the gates, the scan lines, the first terminals and the second terminals.

10. The method of fabricating the thin film transistor array substrate of claim 8, wherein the step of forming the gates, the scan lines and the first terminals further comprises forming a plurality of common line, and wherein the common lines serve as bottom electrodes of a plurality of pixel capacitors and the pixel electrodes above the common lines serve as a plurality of plate electrodes of the pixel capacitors.

11. The method of fabricating the thin film transistor array substrate of claim 10, further comprising forming a plurality of first transparent conductive layers on the gates, the scan lines, the first terminals and the common lines.

12. The method of fabricating the thin film transistor array substrate of claim 8, further comprising forming an ohmic contact layer on the channel layer before the step of forming a photoresist layer over the substrate is performed.

13. The method of fabricating the thin film transistor array substrate of claim 8, wherein a material of the photoresist layer is positive photoresist, and the step of forming the photoresist layer on the channel material layer includes using a photomask, the photomask has a plurality of transparent areas corresponding to a plurality of position of the first terminals, a plurality of opaque areas corresponding to a plurality of positions of the gates and a plurality of semi-opaque areas corresponding to a plurality of positions rather than the first terminals and the gates.

14. The method of fabricating the thin film transistor array substrate of claim 8, wherein a material of the photoresist layer is negative photoresist, and the step of forming the photoresist layer on the channel material layer includes using a photomask, the photomask has a plurality of opaque areas corresponding to a plurality of positions of the first terminals, a plurality of transparent areas corresponding to a plurality of positions of the gates and a plurality of semi-opaque areas corresponding to a plurality of positions rather than the first terminals and the gates.

15. The method of fabricating the thin film transistor array substrate of claim 8, wherein the step of removing the portion of the photoresist layer except that above the gates includes using an ashing process.

* * * * *